(12) United States Patent
Sokol et al.

(10) Patent No.: US 9,173,292 B1
(45) Date of Patent: Oct. 27, 2015

(54) EDGE LAUNCH TRANSITION FOR A PRINTED CIRCUIT BOARD

(75) Inventors: Sergey Sokol, Swampscott, MA (US); Ekrem Oran, Nashua, NH (US)

(73) Assignee: HITTITE MICROWAVE CORPORATION, Chelmsford, MA (US)

( * ) Notice: Subject to any disclaimer, the term of this patent is extended or adjusted under 35 U.S.C. 154(b) by 483 days.

(21) Appl. No.: 13/385,859

(22) Filed: Mar. 9, 2012

Related U.S. Application Data

(60) Provisional application No. 61/464,942, filed on Mar. 11, 2011.

(51) Int. Cl.
*H05K 1/11* (2006.01)
*H05K 3/32* (2006.01)

(52) U.S. Cl.
CPC . *H05K 1/117* (2013.01); *H05K 3/32* (2013.01)

(58) Field of Classification Search
CPC ........ H05K 1/117; H05K 3/0052; H05K 3/32
See application file for complete search history.

(56) References Cited

U.S. PATENT DOCUMENTS

| 6,863,548 B1 | 3/2005 | Coccioli et al. | |
|---|---|---|---|
| 2002/0020555 A1* | 2/2002 | Daido | 174/261 |
| 2004/0141299 A1* | 7/2004 | Huang et al. | 361/807 |
| 2011/0052351 A1* | 3/2011 | Voelker | 414/289 |

OTHER PUBLICATIONS

U.S. Appl. No. 14/613,005, filed Feb. 3, 2015.

* cited by examiner

*Primary Examiner* — Jeremy C Norris
(74) *Attorney, Agent, or Firm* — Knobbe Martens Olson & Bear LLP

(57) ABSTRACT

An edge launch and fabrication method wherein spaced elongated slots are formed through a circuit board. The slots are plated at least along one side thereof connecting ground planes of the circuit board thus forming spaced edge plated regions. Circuit modules are produced by singulating the circuit board along a cut line offset outwardly from the plated slot sides to form an edge launch outwardly extending from and between the spaced edge plated regions.

34 Claims, 8 Drawing Sheets

EDGE LAUNCH TRANSITION FOR A PRINTED CIRCUIT BOARD

RELATED APPLICATIONS

This application claims benefit of and priority to U.S. Provisional Application Ser. No. 61/464,942 filed Mar. 11, 2011 under 35 U.S.C. §§119, 120, 363, 365, and 37 C.F.R. §1.55 and §1.78 which is incorporated herein by this reference.

FIELD OF THE INVENTION

This invention relates to printed circuit boards and the connections made thereto.

BACKGROUND OF THE INVENTION

A printed circuit board (PCB) that includes printed transmission lines such as microstrip or grounded-coplanar with associated ground planes not only provides compact and lightweight circuits, but also provides broadband frequency capabilities.

However, establishing high quality microwave/mmW connections by means of coaxial connectors becomes difficult at frequencies beyond 20 GHz due to certain fundamental problems manifesting themselves as parasitics at the very area of transition from the planar type of transmission line on the PCB or other substrate to the coaxial type of transmission line, such as a coaxial connector.

In recent years there have been some attempts to improve the planar to coaxial transition. One approach disclosed in U.S. Pat. No. 6,863,548, incorporated herein by this reference, was to add ground vias at the edge of the printed circuit board. Another approach is to add wrap-around plating on the edge of the board where the aforementioned transitions occur.

The former approach to implement a planar to coaxial transition has limited use at higher frequencies due to inherent parasitic inductance of the ground vias connecting the ground planes on the top and bottom of the printed circuit boards as well as the internal ground planes in multilayer printed circuit boards.

The latter approach has a higher frequency capability, but may require manual post-fabrication trimming to remove any metallization that can short the RF trace to wrap-around plating. In addition, such trimming may remove some dielectric material at the very end of the microwave/mmW trace where the transition from planar to coaxial transmission line is being established. This removal of dielectric material may lead to degradation of the performance at frequencies beyond 30 GHz due to parasitic inductance.

There have been some implementations to overcome the problems outlined above by using elongated ground vias at the edge of the printed circuit board. One approach requires one elongated side of such via holes to be edge-plated along the side that coincides with the printed circuit board edge in such manner that when the boards are singulated from the panel, the singulating cut would leave some amount of conductor from the edge-plated elongated via hole to remain on the printed circuit board edge. This may somewhat reduce the parasitic inductance of the via holes, but, due to the fact that elongated vias cannot be drilled, but rather must be routed or machined, the routing diameter of the elongated vias must be substantially greater than the diameter of drilled round vias, such that the remaining portions of the conductor deposited in the elongated vias cannot be placed very close to the microstrip launch area.

BRIEF SUMMARY OF THE INVENTION

An edge launch transition is fabricated, in one example, that provides a bandwidth of up to 70 GHz and potentially higher. Such an edge launch transition that can be produced using conventional printed circuit board manufacturing techniques. An edge wrap ground connection preferably does not require post-manufacturing trimming.

In one aspect, an improved edge launch transition for connecting a connector to a printed circuit board having a plurality of ground planes may be provided by including on the printed circuit board an edge launch that extends outwardly beyond an elongated edge-plated region for providing a well-defined, reproducible RF ground path from the connector to the printed circuit board with improved tolerance to mounting edge irregularities or angular misalignment between the connector and the printed circuit board.

The subject invention, however, in other embodiments, need not achieve all these objectives and the claims hereof should not be limited to structures or methods capable of achieving these objectives.

In one embodiment, the edge launch transition for connecting a connector to a printed circuit board includes a printed circuit board having a plurality of ground planes on or within the printed circuit board; an elongated edge-plated region provided on a first edge of the printed circuit board, the elongated edge-plated region connecting the plurality of ground planes; and the printed circuit board having an edge launch on a second edge extending outwardly beyond the first edge for providing a well-defined, reproducible RF ground path from the connector to the printed circuit board with improved tolerance to mounting edge irregularities or angular misalignment between the connector and the printed circuit board.

In a preferred embodiment, the elongated edge-plated region may extend adjacent to the second edge and include a transition from the first edge to the second edge. The transition from the first edge to the second edge may include a rounded edge. The edge plating may extend from the first edge to adjacent the second edge. The edge plating may extend outwardly from the second edge to the first edge from both sides of the connector. The elongated edge-plated region may be provided by routing. The elongated edge-plated region may include an inner rounded edge provided by the routing. The elongated edge-plated region may extend along a full inner edge of the routed edge-plated region. The edge plating may include edge wrapping. The second edge may be offset from the edge plating disposed on the first edge by a distance in the range of between 0.003-0.005 inches or other distance ensuring appropriate location of ground connections. The offset may be equal to or greater than a minimum distance between expected tolerances of the edge plating and the second edge. The printed circuit board may include a plurality of smaller via hole connections near the edge launch between the ground planes. The printed circuit board may further include ground planes on the top and bottom surfaces. The edge launch transition may further include a signal line on the printed circuit board that is coupled to an inner conductor of the connector. The signal line may include a matching circuit adjacent to the edge launch to compensate for electrical parasitic effects associated with the edge launch transition.

In another embodiment, a method provides an edge launch transition for connecting a connector to a printed circuit board having a plurality of ground planes on or within the printed circuit board. The method includes providing an elongated edge on a first edge of the printed circuit board; providing an elongated edge-plated region by disposing an edge plating on the elongated edge to connect the plurality of ground planes; and providing on the printed circuit board an edge launch on a second edge extending outwardly beyond the first edge for providing a well-defined, reproducible RF ground path from the connector to the printed circuit board with improved tolerance to mounting edge irregularities or angular misalignment between the connector and the printed circuit board. Providing the elongated edge may include routing the elongated edge.

Featured is a method of fabricating an edge launch for a circuit module. The method preferably comprises forming (e.g., routing) spaced elongated slots through a circuit board. The slots are plated (e.g., edge wrapped) at least along one side thereof to connect the ground planes of the circuit board thus forming spaced edge plated regions. The circuit board is singulated (e.g., cut) along a cut line offset outwardly from the plated slot sides forming an edge launch for a module which is outwardly extending from and between the spaced edge plated regions.

In one version, the spaced slots are oval shaped and they extend nearly coextensively with an edge of the circuit module. The cut line may be offset from the plated slots sides by a distance in the range of 0.003 to 0.005 inches. The edge launch signal line typically terminates at a location beyond the edge plated regions. The signal line can be formed to include a matching circuit adjacent the edge launch.

Also featured is a method of fabricating an edge launch for a circuit module including forming spaced edge plated regions on an edge of a circuit module connecting the ground planes thereof and forming an edge launch between the spaced edge plated regions extending outwardly therefrom and to include a signal line terminating beyond the edge plated regions Forming the spaced edge plated regions may include routing spaced elongated slots in a circuit board and plating the slots. Forming the edge launch may include cutting the circuit board along a cut line offset outwardly from a side of the elongated slots. A circuit module is also featured and may include spaced edge plated regions connecting ground planes of the circuit module and an edge launch between and offset outwardly from the edge plated regions. A signal line terminates in an edge extending outwardly from the plated regions. The edge launch typically extends between 0.003-0.005 inches outwardly from the spaced edge plated regions and transitions to the spaced edge plated regions via rounded corners. The spaced edge plated regions may extend coextensively or nearly coextensively with a side of the circuit module. Preferably, the spaced edge plated regions are edge wrapped.

One circuit module in accordance with the invention includes spaced edge plated regions connecting ground planes of the circuit module and an edge launch between and offset outwardly between 0.003-0.005 inches from the edge plated regions and transitioning on each side to the spaced edge plated regions via a rounded corner. The edge launch also includes a signal line terminating at a location spaced outwardly from the edge plated regions.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DESCRIPTION OF THE INVENTION

Figure 1:
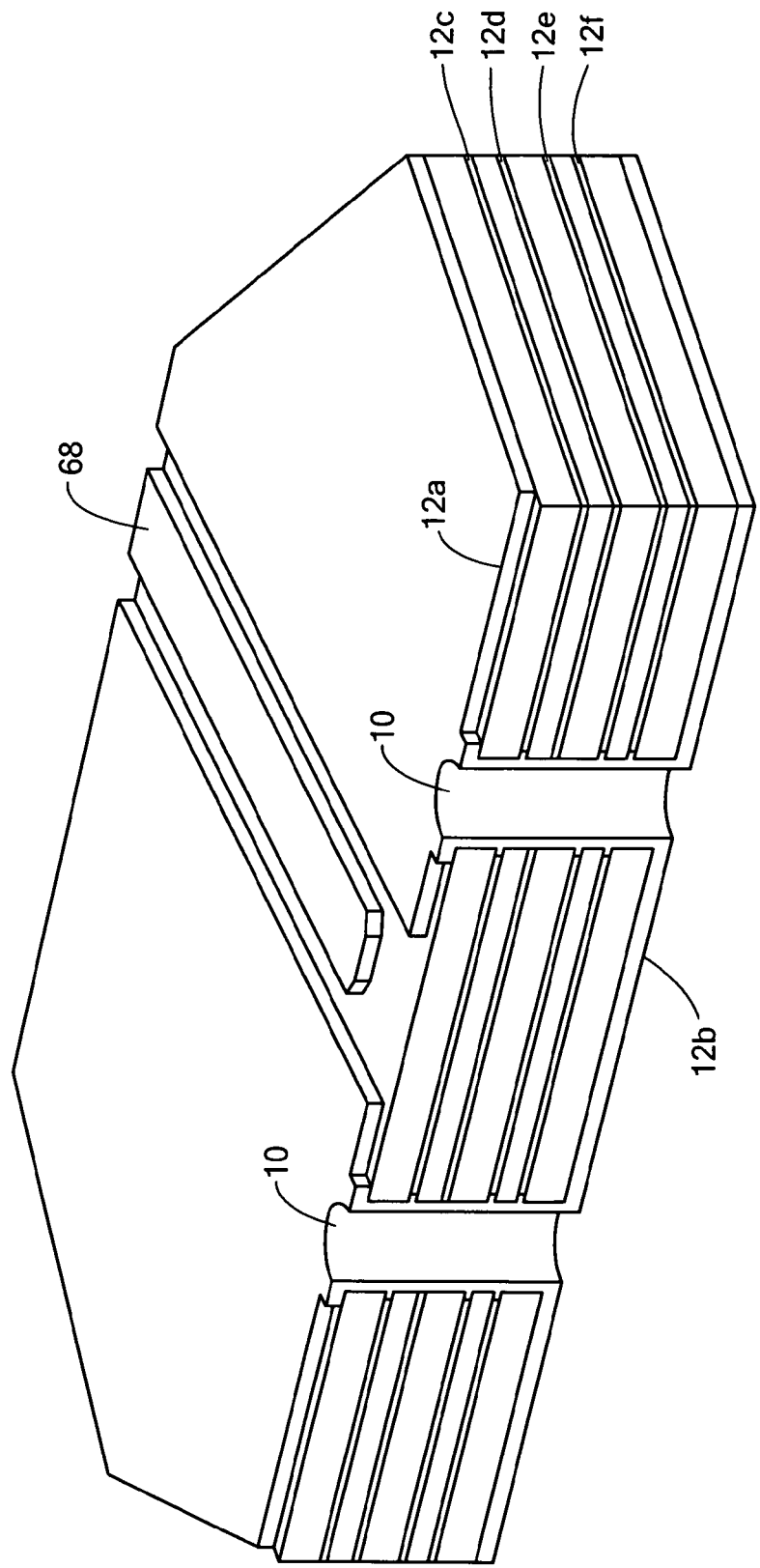
FIG. 1 is a schematic diagram of a prior art edge launch assembly produced using vias.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

One former approach to implement a planar to coaxial transition has limited use at higher frequencies due to inherent parasitic inductance of the ground vias, 10 FIG. 1, connecting the ground planes 12a and 12b on the top and bottom of the printed circuit boards as well as the internal ground planes 12c-12f in multilayer printed circuit boards.

Figure 2:
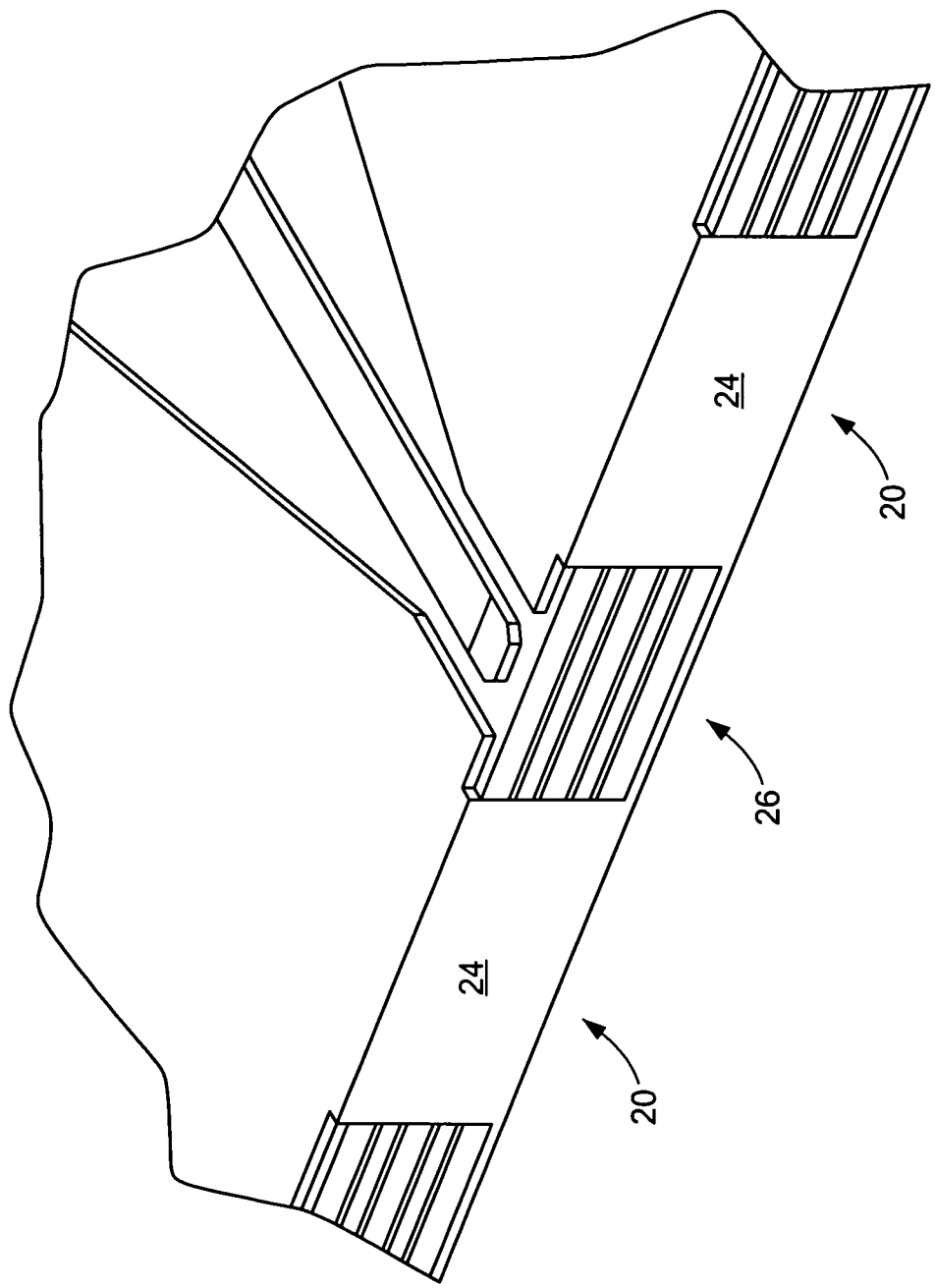
FIG. 2 is a diagram of another prior art edge launch assembly.

The approach shown in FIG. 2 has a higher frequency capability. This approach also requires one elongated side of via holes to be edge-plated along the side that coincides with the printed circuit board edge in such manner such that when the boards are singulated from the panel, the singulating cut would leave some amount of conductor from the edge-plated elongated via hole to remain on the printed circuit board edge. This may somewhat reduce the parasitic inductance of the via holes, but, due to the fact that elongated vias cannot be drilled, but rather must be routed or machined, the routing diameter of the elongated vias must be substantially greater than the diameter of drilled round vias, such that the remaining portions of the conductor 24 deposited in the elongated vias cannot be placed very close to the microstrip launch area 26. There is also a high risk of removing this plated edge completely during board singulation due to tolerances.

Various prior approaches may require manual post-fabrication trimming to remove any ground that can short the connector. In addition, such trimming may remove some dielectric material at the very end of the microwave/mmW trace where the transition from planar to coaxial transmission line is being established. This removal of dielectric material may lead to degradation of the performance at frequencies beyond 30 GHz due to parasitic inductance.

Figure 3:
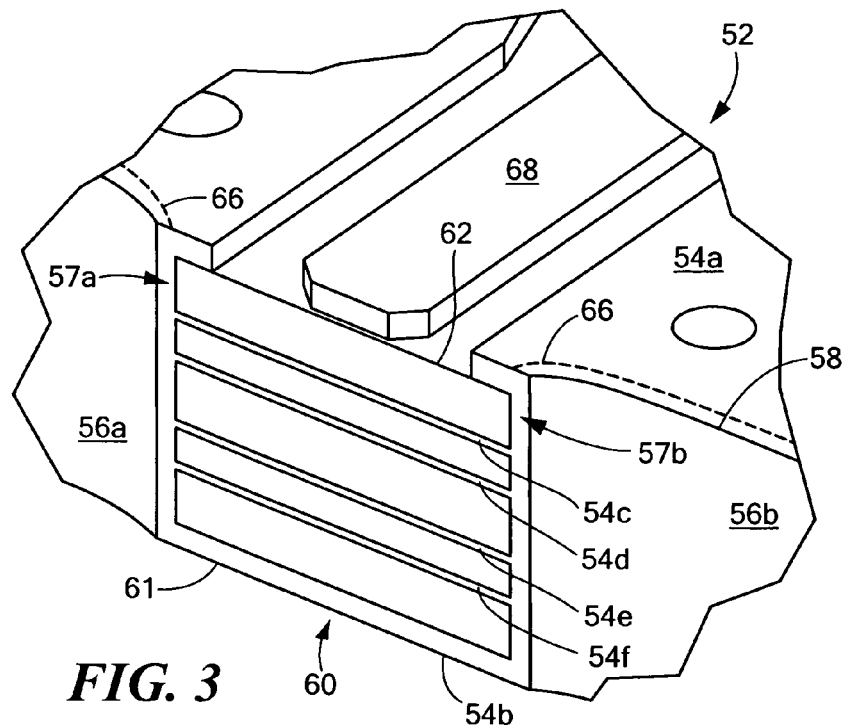
FIG. 3 is a schematic diagram of an edge launch transition in accordance with one embodiment of the invention.

In one embodiment of the invention, there is shown in FIG. 3 an edge launch transition 60 for connecting a connector to a printed circuit board module 52 having a plurality of ground planes 54a and 54b on the top and bottom of printed circuit board 52 and ground planes 54c-f within printed circuit board 52. Spaced edge-plated regions 56a and 56b are typically provided on a side or edge 58 of printed circuit board 52. The elongated edge-plated regions 56 includes an edge plating disposed thereon connecting the plurality of ground planes 54a-f; the connection between edges 57a,57b of edge-plated regions 56a, 56b and rf ground plane layers 54a and 54c can be the most critical. In some embodiments there is only one edge plated region. Printed circuit board module 52 also includes an edge launch 60 extending outwardly to edge 62 beyond first edge 58; this arrangement provides a well-defined RF path between RF ground plane layers 54a, 54c and a launch connector mounted at edge 52 and soldered to regions 56a, 56b. It also provides a better fit with a greatly reduced gap between such connector and edge launch 60. Here, the edge plating is on the flat edge of the board and then curves outwardly to join with the launch along edges 57a and 57b. Note how signal line 68 may extend to board edge 62, beyond the flat edge plated regions 56a, 56b of the board. In some configurations, there may be more than one signal line between the edge plated regions.

Figure 4:
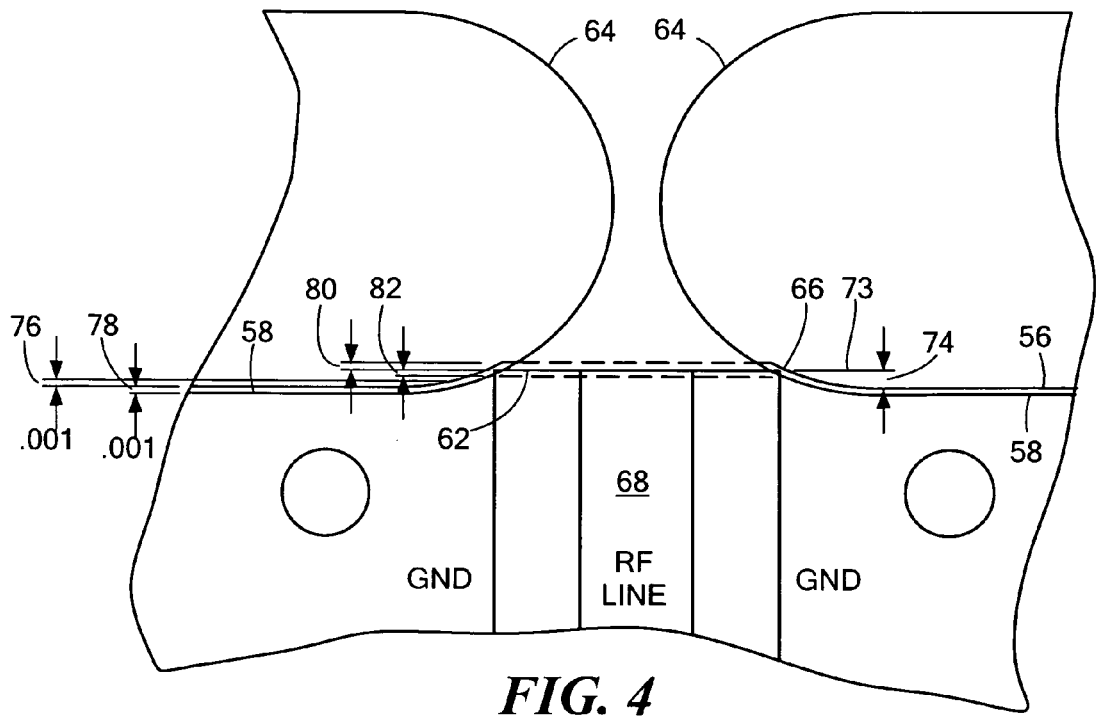
FIG. 4 is a top view of elongated slots and a singulation line used to produce the edge launch transition of FIG. 3.

The elongated edge-plated regions 56 may be provided by routing a printed circuit board to provide a transition from the first edge 58 to the edge 62 in which the transition takes the form of an inner rounded edge 66. Exemplary routing lines 64 are shown in FIG. 4. The elongated edge-plated regions 56 may extend along the full inner edge of the routed vias or slots and include an edge plating thereon such as an edge wrapping. The elongated edge-plated region may extend fully to the corners of the circuit module. At a minimum, they should extend beyond the edges of the launch connector flange, as described below. Preferably, the edge-plating uses the full rounded inner-edge 66 for edge plating of the slots which is easier to fabricate than the edge plating called for by the prior art due to the significantly lower sensitivity to the manufacturing tolerances (board singulation) of edge launch transition 60.

Figure 5:
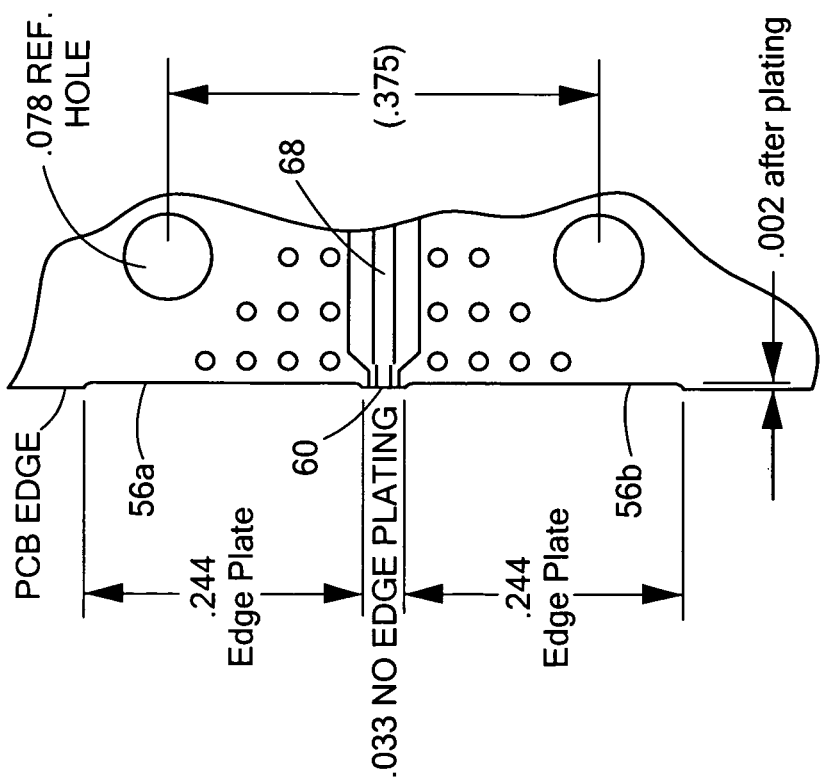
FIG. 5 is a top view of a singulated circuit module.

The edge launch extension may be created at the stage of the printed circuit board cutting or singulation. Preferably, the cut line 73 is offset from the flat portion of the wrap-around edge plating disposed on first edge 58 by a small amount such as, for example, a distance in the range of between 0.003-0.005 inches. The amount of the offset 74, FIG. 4, is preferably greater than the minimum distance between the expected tolerances 76 and 78 of edge plating 56 and the expected tolerances 80 and 82 of the singulating cut line at second edge 62. This allows compensation for manufacturing tolerances and it brings the edges 57a, 57b of remaining conductor/wrap-around edge plating closer to the launch area 60 than is possible with the prior approaches and allows more accurate placement of these edges with respect to RF signal line 68 so as to provide a consistent and well-defined ground return RF current path. In a preferred embodiment shown in FIG. 5, the separation between edges 57a and 57b is about 0.033 inches, and the separation between these edges and the nearest edge of signal line 68 is about 0.01 inches.

Figure 6:
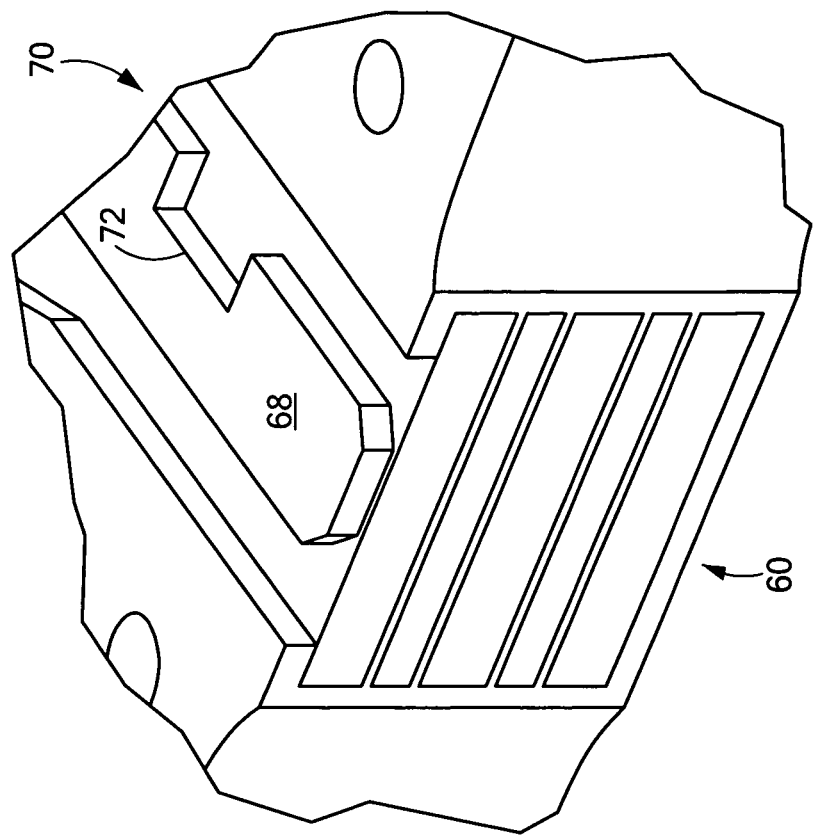
FIG. 6 is a schematic diagram of an edge launch transition with a matching circuit on the signal line.

To compensate for remaining electrical parasitic effects associated with the launch transition, the signal line 68 on the PCB may include a small matching circuit 70, FIG. 6, such as the narrower notch 72 in the signal line which may be included on the PCB near edge launch 60.

Figure 7A:
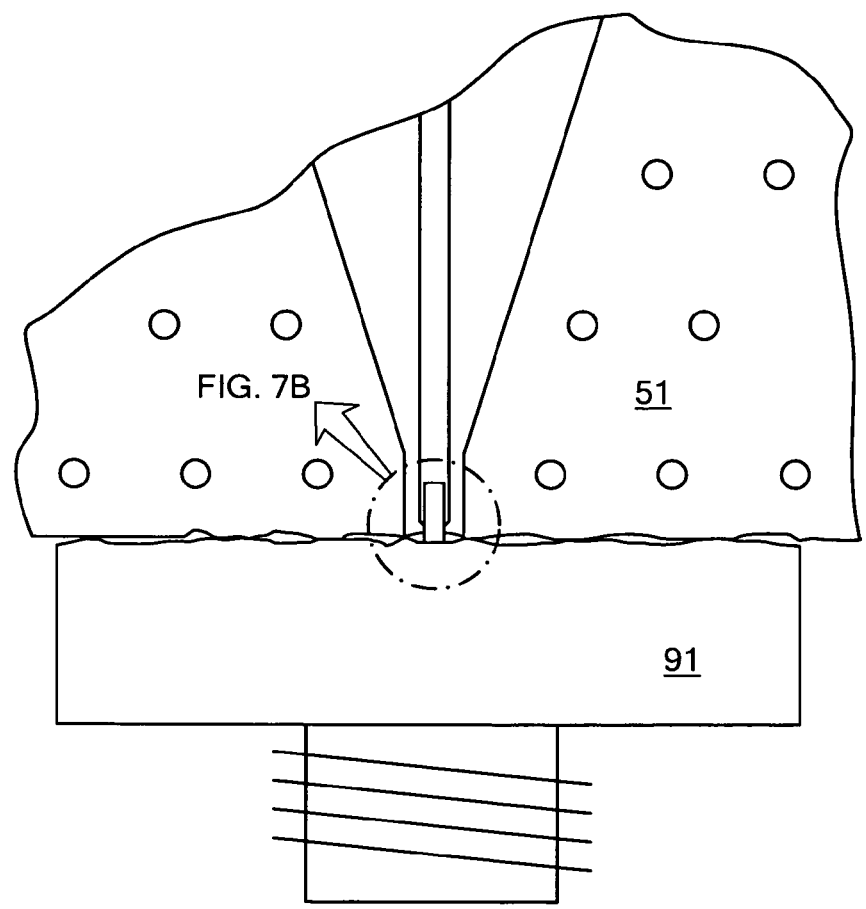
FIGS. 7A-7B are schematic diagrams of a prior art edge launch assembly with a connector flange attached thereto.
Figure 7B:
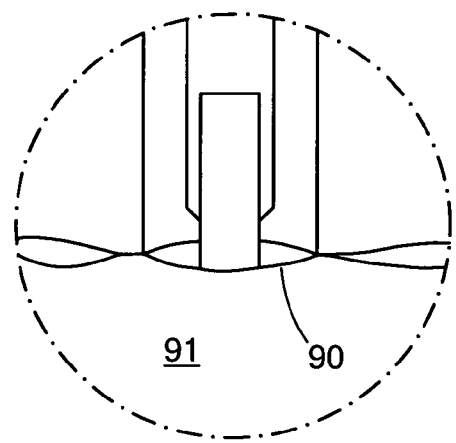

In the absence of the proposed board edge-extension transition design, board-edge and launch flange surface irregularities can lead to ill-defined contact points 90, FIGS. 7A-7B, between the ground planes of the launch flange 91 and PCB 51.

Figure 8A:
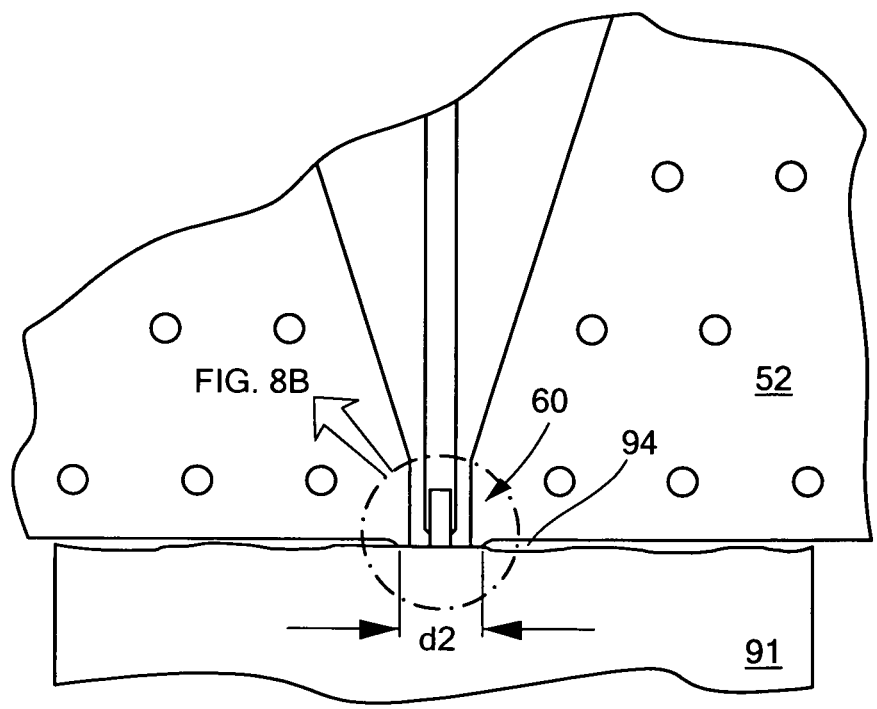
FIGS. 8A-8B are schematic diagrams of the edge launch transition of FIG. 3 with a connector flange attached thereto.
Figure 8B:
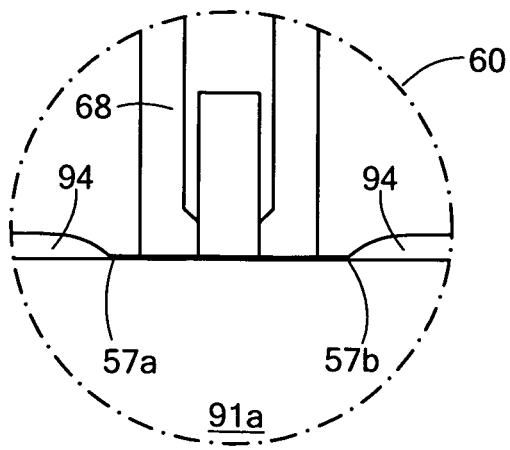

In contrast, embodiments of the subject edge launch 60, FIGS. 8A-8B, create a knife-edge-like structure on the wrap-around edge plating along edges 57a, 57b, which enhances the repeatability of RF ground return path between the coax launch flange 91 and the PCB. It also promotes solder flow into the wrap-around ground gap regions 94, away from the center conductor further improving the repeatability of the ground connection and minimizing the likelihood of solder-bridges.

Figure 9:
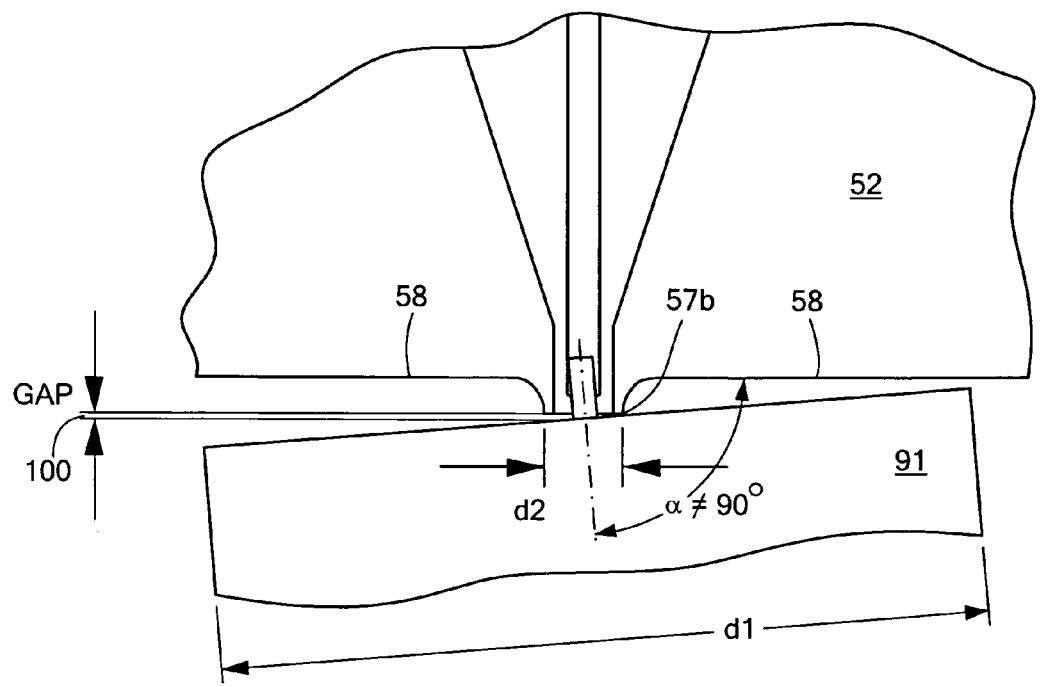
FIG. 9 is a schematic diagram of the edge launch transition of FIG. 3 showing the greatly reduced gap resulting from alignment error between the edge launch transition and a connector flange attached thereto.
Figure 10:
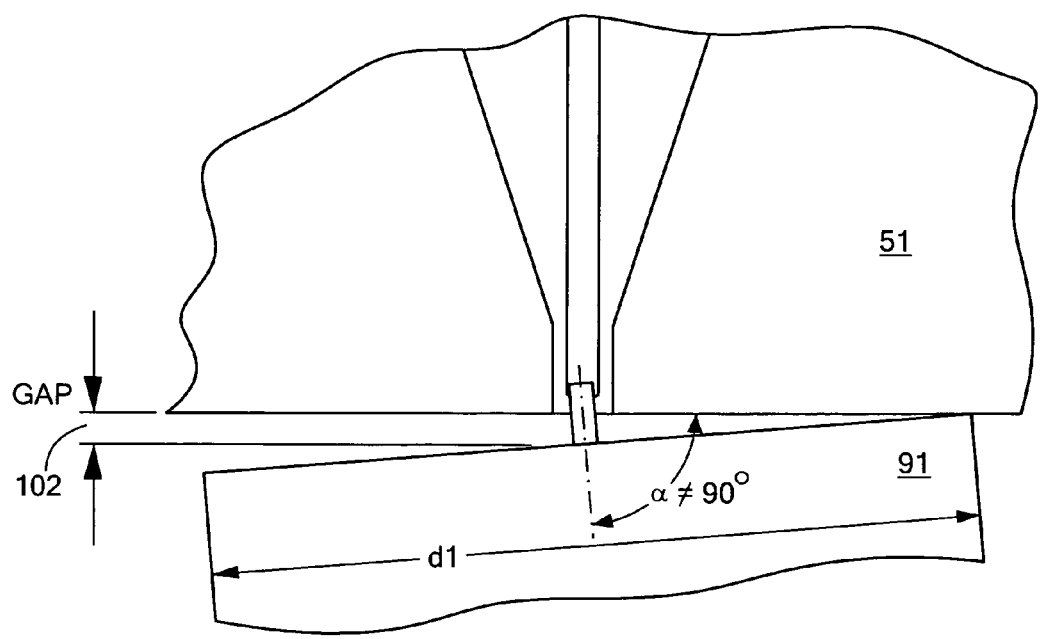
FIG. 10 is a schematic diagram of a prior art edge launch assembly showing the possible gap resulting from alignment error between the edge launch assembly and a connector flange attached thereto.

The knife-edge structure of the edge launch 60 also provides better performance with respect to angular alignment errors of the launch connectors during assembly. FIG. 9 shows that the resulting gap 100 in the transition region is minimized in comparison to the gap 102, FIG. 10, in previous printed circuit board configurations. FIG. 9 also illustrates the importance for the recessed, plated edge-slot surfaces 58 to extend at least beyond the edges of the launch connector flange so at to allow the flange to the board along plated edge 57b.

Figure 11:
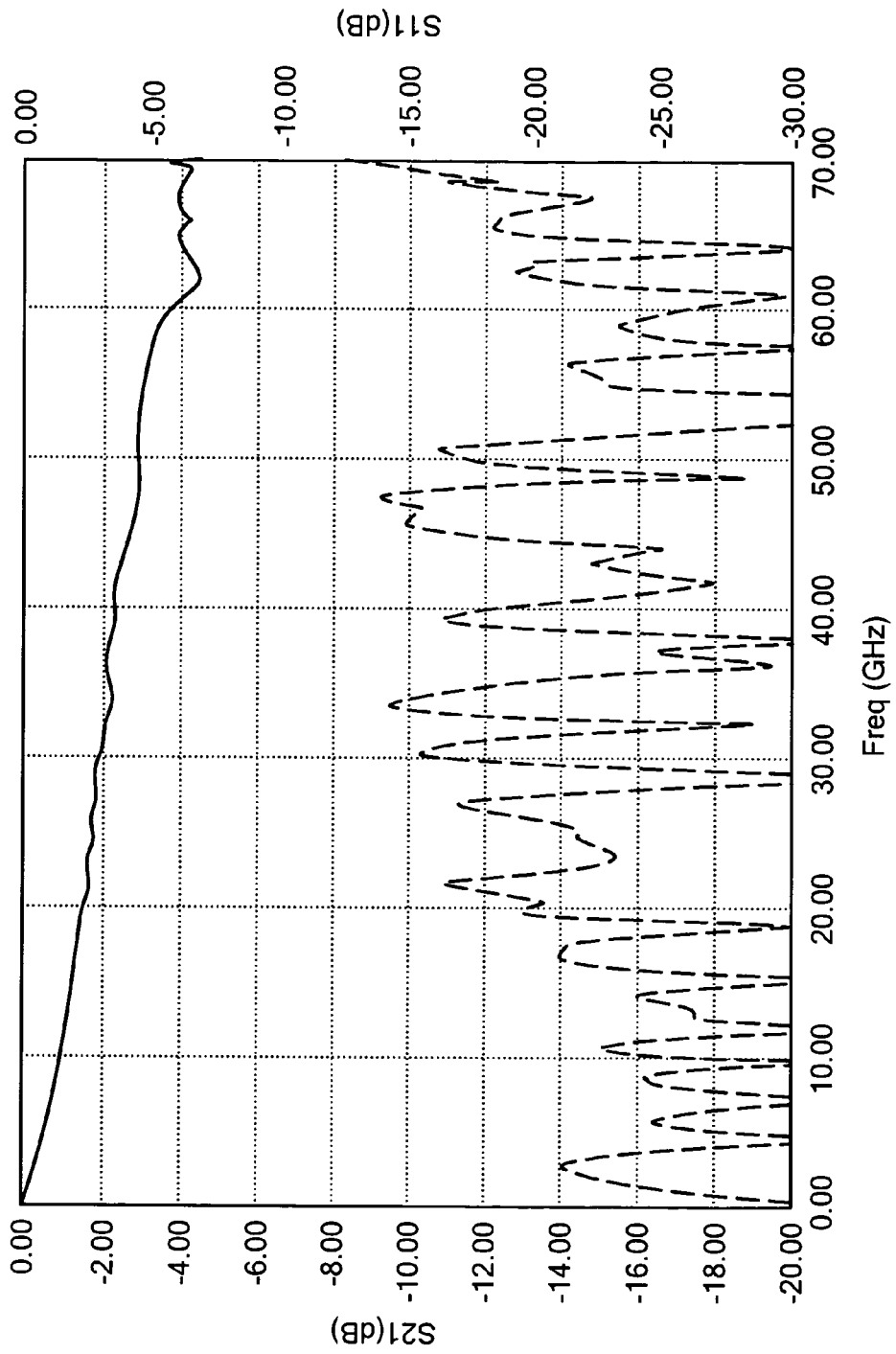
FIG. 11 is a plot showing the measured insertion and return loss responses for pairs of the edge launch transitions connected by a length of transmission line printed on a PC board.

FIG. 11 shows the measured insertion and return loss for a pair of the preferred embodiment edge launch transitions connected by a straight length of transmission line printed on the PC board. The good impedance match of the transitions is evident from the better than 11 dB return loss measured up to 40 GHz or 50 GHz using K- or 2.4 mm type coaxial connectors, respectively.

Embodiments of the invention provide a microwave/mmW edge launch transition having a bandwidth of up to 67 GHz and, potentially, higher, while addressing the disadvantages outlined above by employing edge-wrap ground connection that typically does not require post-manufacturing trimming or other post-fabrication manipulations. The subject edge launch transition may be produced using conventional, well established and widely used printed circuit board manufacturing techniques, which makes it inexpensive and repeatable, and may also use other microwave/mmW substrate materials.

The subject edge launch transition also allows for ground-signal-ground (GSG) RF probing as an alternative to using coaxial connectors, which may be used, for example, on evaluation boards or fixtures.

Aside from the preferred embodiment or embodiments disclosed above, this invention is capable of other embodiments and of being practiced or being carried out in various ways. Thus, it is to be understood that the invention is not limited in its application to the details of construction and the arrangements of components set forth in the preceding description or illustrated in the drawings. If only one embodiment is described herein, the subject invention is not to be limited to that embodiment. Moreover, scope of the subject invention is not to be read restrictively unless there is clear and convincing evidence manifesting a certain exclusion, restriction, or disclaimer.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A circuit module comprising:
   at least one flat edge plated region connecting ground planes of the circuit module; and
   an edge launch offset outwardly from the flat edge plated region and including at least one signal line,
   wherein the edge launch includes a planar to coaxial transition.

2. The circuit module of claim 1 in which the edge launch extends between 0.003-0.005 inches outwardly from the spaced edge plated region.

3. The circuit module of claim 1 in which the edge launch transitions to the spaced edge plated region via rounded corners.

4. The circuit module of claim 1 in which the spaced edge plated region extends coextensively or nearly coextensively with a side of the circuit module.

5. The circuit module of claim 1 in which said spaced edge plated region is edge wrapped.

6. The circuit module of claim 1 in which the signal line includes a matching circuit adjacent the edge launch.

7. A circuit module comprising:
   spaced edge plated regions connecting ground planes of the circuit module;
   an edge launch between and offset outwardly between 0.003-0.005 inches from the edge plated regions and transitioning on each side to the spaced edge plated regions via a rounded corner; and
   the edge launch including at least one signal line terminating at an end of the edge launch.

8. The circuit module of claim 7 wherein the circuit module is configured to support RF, microwave, and mmW frequencies.

9. The circuit module of claim 7 wherein the edge launch allows for a ground-signal-ground connection.

10. The circuit module of claim 7 further comprising a knife-edge-like structure between the edge launch and the spaced edge plated regions.

11. A method of fabricating an edge launch for a circuit module, the method comprising:
    forming spaced elongated slots through the circuit board;
    plating the slots at least along one side thereof connecting ground planes of the circuit board and forming spaced edge plated regions; and
    producing circuit modules by singulating the circuit board along a cut line offset outwardly from said plated slot sides forming an edge launch outwardly extending from and between the spaced edge plated regions, wherein the edge launch includes a planar to coaxial transition.

12. The method of claim 11 in which said spaced slots are oval shaped.

13. The method of claim 11 in which said spaced slots extend nearly coextensively with an edge of the circuit module so as to extend beyond the edges of a launch connector flange to be mated with the edge launch.

14. The method of claim 11 in which singulating includes cutting the circuit board along said offset cut line.

15. The method of claim 11 in which forming the slots includes routing.

16. The method of claim 11 in which plating includes edge wrapping.

17. The method of claim 11 in which said cut line is offset from the plated slots sides by a distance in the range of 0.003 to 0.005 inches.

18. The method of claim 11 in which the edge launch includes one or more signal lines terminating at a location at or near the cut line.

19. The method of claim 18 in which the signal line is formed to include a matching circuit adjacent the edge launch.

20. The method of claim 18 in which the cut edges of the plated slots are approximately 0.01 inches from the nearest edge of the signal line.

21. The method of claim 11 wherein the circuit module is configured to support RF, microwave, and mmW frequencies.

22. The method of claim 11 wherein the edge launch allows for a ground-signal-ground connection.

23. The method of claim 11 further comprising soldering a connector to the edge launch and allowing solder to flow into a space left by an offset between the edge launch and the spaced edge regions formed by the cut line offset.

24. A method of fabricating an edge launch for a circuit module, the method comprising:
    forming spaced edge plated regions on an edge of a circuit module connecting the ground planes thereof; and
    forming an edge launch between the spaced edge plated regions extending outwardly therefrom and including at least one signal line configured to be coupled to a launch connector configured to be mated with the circuit module,
    wherein the circuit module is configured to support RF, microwave, and mmW frequencies.

25. The method of claim 24 in which forming spaced edge plated regions include routing spaced elongated slots in a circuit board and plating the slots.

26. The method of claim 25 in which forming the edge launch includes cutting the circuit board along a cut line offset outwardly from a side of the elongated slots.

27. The method of claim 26 in which said cut line is offset from the plated slots sides by a distance in the range of 0.003 to 0.005 inches.

28. The method of claim 26 in which the edge of the edge plated region is approximately 0.01 inches from the nearest edge of the signal line.

29. The method of claim 26 in which the signal line is formed to include a matching circuit adjacent the edge launch.

30. The method of claim 25 in which the elongated slots are oval shaped.

31. The method of claim 25 in which the elongated slots extend nearly coextensively with an edge of the circuit module so as to extend beyond the edges of the launch connector flange.

32. The method of claim 24 in which forming spaced edge plated regions includes edge wrapping.

33. A circuit module comprising:
    spaced edge plated regions connecting ground planes of the circuit module;
    an edge launch between and offset outwardly between 0.003-0.005 inches from the edge plated regions and transitioning on each side to the spaced edge plated regions via a rounded corner; and
    the edge launch including at least one signal line terminating at a location spaced outwardly from the edge plated regions, wherein the edge launch includes a planar to coaxial transition.

34. A method of fabricating an edge launch for a circuit module, the method comprising:
    forming spaced edge plated regions on an edge of a circuit module connecting the ground planes thereof; and forming an edge launch between the spaced edge plated regions extending outwardly therefrom and including at least one signal line configured to be coupled to a launch connector configured to be mated with the circuit module, wherein the edge launch includes a planar to coaxial transition.

* * * * *